United States Patent [19]

Furumoto et al.

[11] Patent Number: 5,369,659
[45] Date of Patent: Nov. 29, 1994

[54] FAULT TOLERANT OPTICAL SYSTEM USING DIODE LASER ARRAY

[75] Inventors: Horace W. Furumoto, Wellesley; William C. Goltsos, Burlington; Robert H. Rediker, Watertown, all of Mass.; Robert Sze, Santa Fe, N. Mex.

[73] Assignees: Cynosure, Inc., Bedford; Massachusetts Institute of Technology, Cambridge, both of Mass.; Stablelase, Inc., Santa Fe, N. Mex.

[21] Appl. No.: 163,160

[22] Filed: Dec. 7, 1993

[51] Int. Cl.⁵ .................................................. H01S 3/19
[52] U.S. Cl. ........................................ 372/50; 372/101
[58] Field of Search ........................ 372/50, 101, 108

[56] References Cited

U.S. PATENT DOCUMENTS

| | | | |
|---|---|---|---|
| 4,813,762 | 3/1989 | Leger et al. | 372/44 |
| 4,972,427 | 11/1990 | Streifer et al. | 372/50 |
| 5,027,359 | 6/1991 | Leger et al. | 372/18 |
| 5,140,608 | 8/1992 | Karpol et al. | 372/101 |

FOREIGN PATENT DOCUMENTS

| | | | |
|---|---|---|---|
| 0004007 | 1/1982 | Japan | 372/50 |
| 0081222 | 3/1989 | Japan | 372/101 |

OTHER PUBLICATIONS

Leger, James R. and Goltsos, William C., "Geometrical Transformation of Linear Diode-Laser Arrays for Longitudinal Pumping of Solid-State Lasers," IEEE Journal of Quantum Electronics, vol. 28, No. 4, Apr. 1992.

*Primary Examiner*—Georgia Y. Epps
*Attorney, Agent, or Firm*—Hamilton, Brook, Smith & Reynolds

[57] ABSTRACT

The individual outputs of a large laser diode array are combined using an optical transformer of diffractive optics. To allow for the tolerances in the laser array and combining optics required for mass production, the system further includes corrector optics. The corrector optics includes individual lens elements which are fabricated to provide specific correction of faults in the individual lasers and associated combining optics resulting from manufacturing tolerances. The preferred corrector lenses include diffractive lenses fabricated by laser milling.

27 Claims, 5 Drawing Sheets

FAULT TOLERANT OPTICAL SYSTEM USING DIODE LASER ARRAY

BACKGROUND

There are many applications in which it is desirable to concentrate the power from a laser array such as an array of many semiconductor laser diodes. One example is that of optical pumping of another laser such as an Nd:YAG laser. Another field is that of medical lasers. For example, lasers have been used to successfully treat vascular lesions through the method of selective photothermalysis. In surgical applications, a laser such as a 100 watt YAG laser may be desirable. 100 watt diode arrays are now available, but the difficulties in optically coupling the power from hundreds of diodes into a single fiber of a delivery system have limited commercial fiber coupled systems to 25 watts.

Geometric optics used to combine the outputs of multiple lasers are large, cumbersome and expensive. Another approach has been to couple the outputs from segments of a diode array into multiple fibers and densepack the fibers into a random bundle. Such a system is limited to about 10 watts and is expensive.

Yet another approach to combining the outputs of a laser array has recently been presented by Leger and Goltsos in "Geometrical Transformation of Linear Diode-Laser Arrays for Longitudinal Pumping of Solid-State Lasers," IEEE J. Quantum Electron., Volume 28, pages 1088–1100 (1992). In that system, a diffractive optics transformer transforms the beams from a linear array of many semiconductor laser diodes into a two-dimensional array of collimated beams which may then be focused to the end of an optically pumped laser.

SUMMARY OF THE INVENTION

The performance of the diffractive optics transformer is very sensitive to the geometry of the outputs from the laser array. Commercially available arrays are fabricated on semiconductor bars that bow, tilt and cant. The present invention is directed to a method and the resultant optics which provide for a fault tolerance in a mass produced optical system of a laser array and associated optics, particularly combining optics.

In accordance with principles of the invention, the beams from the many lasers in a laser array are combined by 1) in a lenslet array, collimating beams from a laser array, 2) in a customized corrector lenslet array, optically correcting for the faults in the laser array and in the collimating lenslet array, 3) directing the corrected collimated beams into an optical transformer for fill-factor enhancement and 4) focusing into, for example, an optical fiber. In the manufacturing production line there is one station to diagnose each of the beams emerging from the first lenslet array and yield the information (e.g., tilt, focus, astigmatism, spherical aberration) necessary to prescribe corrector lenses. A second station on the line produces the array of prescription corrector lenses required to individually correct each laser beam. Because the corrector lenses only provide corrections, and not the full collimation, they can be weak lenses and are those more readily fabricated. In the preferred embodiment, the array of corrector lenses comprises diffractive optics.

The time for the diagnosis of the beams and the time to fabricate the corrector lenses must be minimized to increase the throughput of the production line consistent with low cost. In the fabrication of the diffractive corrector lenses in one embodiment, a pulsed ultraviolet laser, such as an excimer laser operating at 10 kHz, is used to mill 2000 diffractive corrector lenses in less than 10 minutes. Diffractive lenses are characterized by a surface relief pattern which provides fractional wavelength path differences to diffract the light and thus shape the wavefront of the beam. These diffractive lenses may have 16 discrete levels so that their efficiency in diffracting the light approaches 96%. If each of the diode lasers produces 100 mW, and if one assumes that the optical throughput of the system is only 50%, the output power of a 2000 laser array is 100 W. This power is just illustrative and should not be construed in any way as being limiting. With this invention the corrected semiconductor laser array to produce high power in one beam is fault tolerant, mass producible and low cost.

In meeting the principles presented above, an optical system embodying the present invention comprises a laser array of a plurality of lasers illuminating along individual optic axes. Combining optics combine light from the plurality of lasers. Corrector optics include an array of corrector optical elements individually associated with the lasers. The corrector optical elements are of optical designs specific to associated lasers to correct faults in the lasers and associated combining optics. Preferably, the combining optics include an array of combining optical elements individually associated with laser sources but being nonspecific to manufacturing variations in the lasers. Specifically, the combining optical elements include a fill factor enhancing optical train and a focusing lens. The fill factor enhancing optical train contains collimator lenslets between the laser array and the corrector optics and an optical transformer. Preferably, but not necessarily, the corrector optical elements include diffractive optics. In one implementation, the corrector optical elements are a combination of refractive optics for tilt correction and diffractive optics for focus correction.

In a method of manufacturing a laser array with associated optics, a laser array and lens array are fabricated, lenses of the lens array being associated with individual lasers. Optical characteristics of the combined laser array and lens array are diagnosed and a corrector lens array is fabricated. By thus diagnosing and fabricating the corrector lenses, those lenses may correct for laser beam tilt as well as focal errors.

The preferred method of fabricating the diffractive optics is that of laser milling. In the laser milling operation, light rings of controlled diameter, width and intensity are sequentially generated to mill grooves of the diffractive optics into a lens substrate. Different grooves or different depths of grooves may be milled with successive laser pulses. One method of generating the milling light rings is by exposing the lens substrate to the milling laser through an axicon pair. The width of the ring generated by the axicon pair may be controlled by means of an iris, and the intensity of the ring may be controlled by cross-polarizers.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF A PREFERRED EMBODIMENT

Figure 1A:
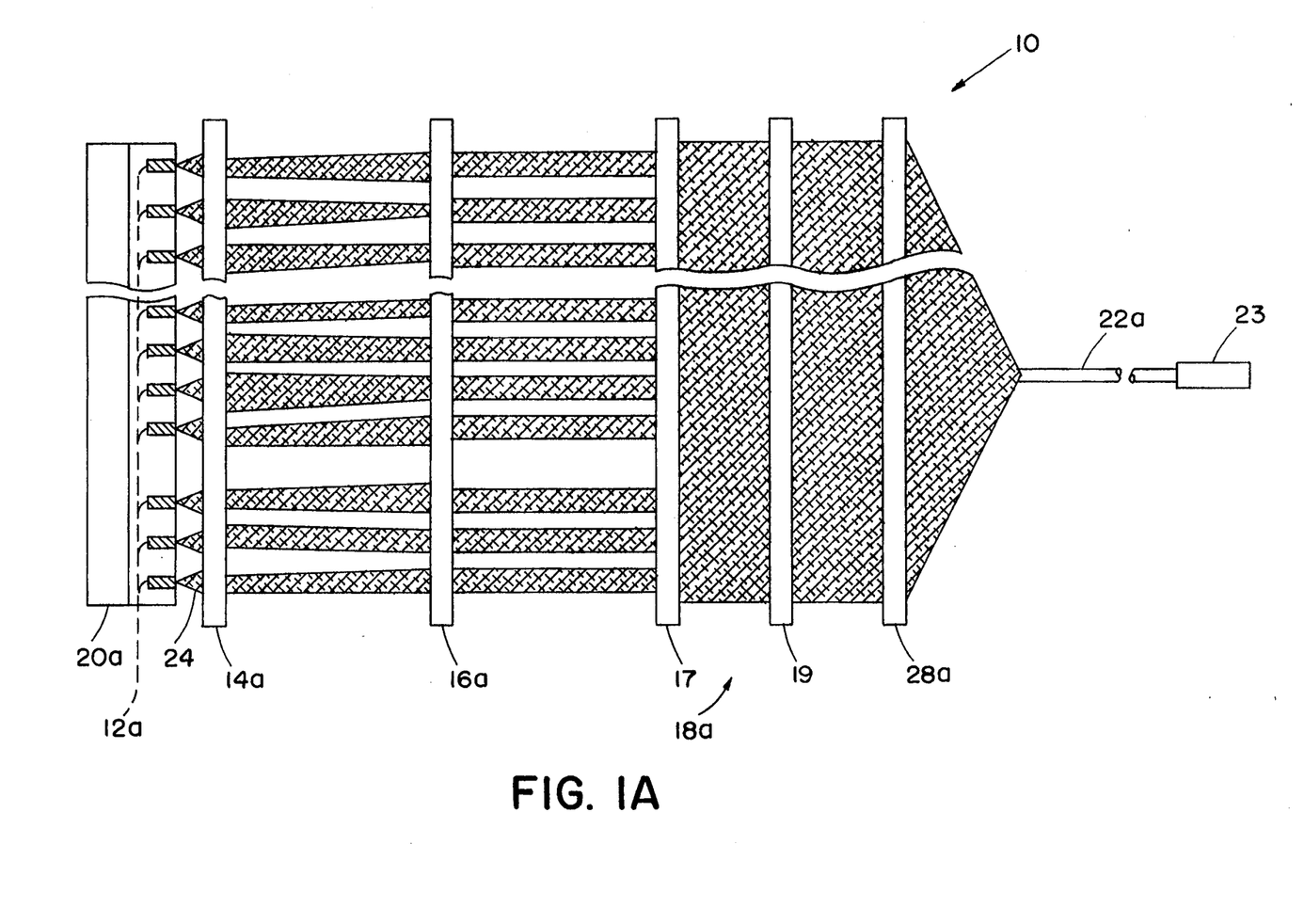
FIG. 1A is a schematic illustration of the incoherent combining of beams from a one-dimensional diode laser array using an array of corrector lenses according to the present invention.

In FIG. 1A, a one-dimensional schematic illustration of a beam combining system 10 is shown, including a diode laser array 12a, a collimating lens array 14a, a corrector lens array 16a, an optical transformer 18a, and a focusing lens 28a. The system can also include a heat sink 20a for the laser array and an optical fiber 22a to collect the power in the output beam and deliver the light beam to a delivery system 23 such as a medical delivery system.

Figure 1B:
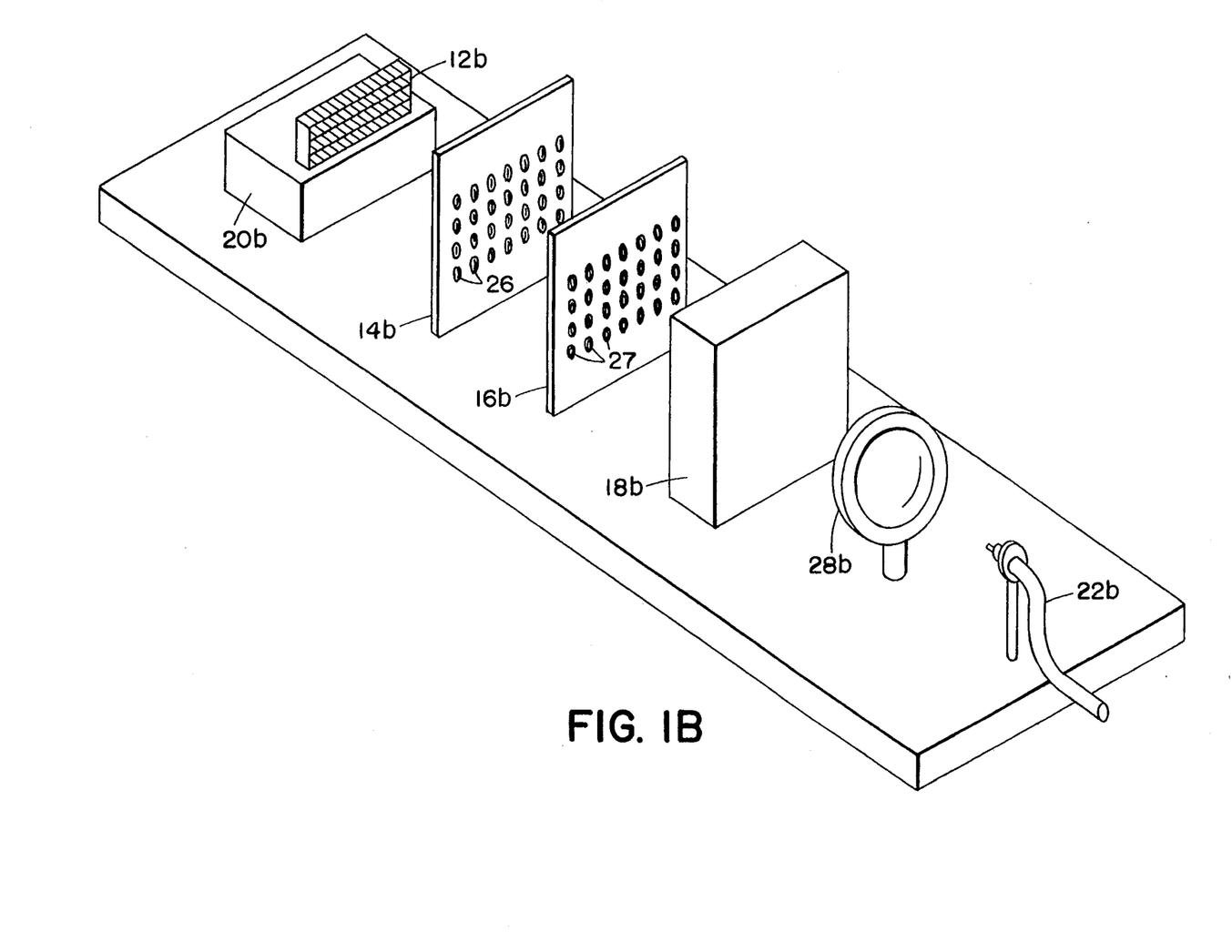
FIG. 1B is a perspective illustration of an optical system embodying the invention with correction for a two-dimensional laser array.

FIG. 1B is a perspective illustration of a system similar to that presented in FIG. 1A but providing incoherent beam combining from a two-dimensional laser array 12b mounted to a heat sink 20b. A collimating microlens array 14b of geometric (refractive) microlenses 26, each associated with an individual laser 12b, provides initial collimation of the laser beams. As before, due to manufacturing tolerances, that collimation is imperfect. In fact, the collimating optics may be designed to intentionally provide a small amount of convergence or divergence from all lenses so that all of the corrector lenses are of the same type.

The corrector microlens array 16b includes an array of microlenses 27, preferably including diffractive optics, each associated with one of the lasers 12b and collimating microlenses 26. As before, a diffractive transformer 18b serves to enhance the fill factor of all of the beams. The focusing lens 28b provides final focusing and combining of all beams onto the end of the fiber 22b.

A novel feature of the invention is the corrector array of lenses 16 and its fabrication using a technique amenable to mass production of the system illustrated in FIGS. 1A and B. A specialized system having a transformer similar to that of FIG. 1A but without the separate collimator array 14a or corrector array of lenses 16a was used by Leger and Goltsos to take the radiation from a sparse linear array, a 1-cm bar with 200 stripe (edge emitting) lasers, and transform it into a square array of beams which could be efficiently coupled into a medical fiber. In the Leger and Goltsos system, the laser associated with each lens 26 was actually a subarray of laser devices rather than a single laser device as illustrated in FIG. 1A. Either configuration is acceptable. Further, in the diffractive transformer optics of Leger and Goltsos, the first plane of diffractive optics 17 provided collimation of the input beams and redirection between the plates 17 and 19. The optics on plate 17 reconfigured the linear array of beams into a two-dimensional array of beams. In accordance with the present invention, the collimation function is separated from the transformer 18a into a separate collimating array 14a so that the corrector optics 16a can be provided after the collimating array.

Leger and Goltsos provided diffractive optics in which the zones were elliptical rings. (Across each zone, the wavefront is retarded by $2\pi$ or equivalently by one wavelength.) That was required by an astigmatism of the laser array used in that system. Although in the present optics the zones are circular rings because the system disclosed is based on lasers which do not suffer that astigmatism, the present optics could be easily modified to correct for such an astigmatism.

The corrector array of lenses allows the other major elements of the system, 12a, 14a and 18a, to be inexpensively mass produced with relaxed parameter tolerance. On the other hand, because the mass produced collimating array 14a provides a substantial amount of collimation, the corrector lenses 16a may be of very low power and thus be more readily fabricated on an individual basis.

The corrector array of lenses is particularly important in using stacked bars of diode arrays as in FIG. 1B to provide fault tolerance in the alignment of bars and their cant with respect to the lens array. In the medical application, this mass-produced system using a multiplicity of stacked laser bars couples over 100 watts into the medical fiber at a cost low enough that it is attractive to be used in the physician's office.

A more detailed description of the four major elements 12a, 14a, 16a, 18a of FIG. 1A follows.

A major manufacturer of the c-w diode laser array 12 is Spectra Diode Laboratories. The semiconductor bar, in one embodiment is GaAs on which a 100-laser or larger laser array is fabricated. The bar bows because there is not a perfect thermal match between the bar and its mount. The bar is tilted because the solder used in mounting is uneven, and the bar cants in and out because of the mounting process. The problem of matching a mass producible optics system is exacerbated when bars of linear arrays are stacked to produce two dimensional arrays. Lining up the lasers in the bar-to-bar direction to tolerances of the order of micrometers is a nearly impossible task. The canting from bar to bar will be different. With a mass-producible two-dimensional optical lens array 14 to collimate the beam, the canting varies the distances from the lasers to the lenses and therefore changes the outputs from collimated to converging or diverging. To require a manufacturer to make every element in a multi-element array perfectly removes the product from ever being commercially practical at reasonable cost.

The semiconductor bar is mounted on a heat sink 20a which may be copper. The heat sink for each bar may be integral with a block of copper, not shown, which may be cooled by flowing or sprayed water. The details of the fabrication, mounting, etc., of the array of lasers is not the subject of this invention but is mentioned for completeness. The output from the array of lasers is a diverging optical beam with the angle of divergence different in two orthogonal directions. The divergence in one dimension is shown in FIG. 1A at 24. The optical beams are then incident on the array of collimating lenses 14a.

The array of collimating lenses 14a is, in one embodiment, of geometrical (refractive) microlenses. One such lens array, the Corning "SMILE lens array" is of glass. An alternative is of stamped arrays out of plastic. In another embodiment the collimating lenses would be high-throughput diffractive lenses. In yet another embodiment the array of microlenses would be of a high-refractive-index material transparent to the laser output. One such material used in the fabrication of microlenses is GaP.

In the first realization the Corning "SMILE lens array" is used with 85.0 $\mu$m diameter lenses with a pitch (center-to-center distance) of 100 $\mu$m. The pitch can vary over the 100-element array. The corrector lens array to be described below also corrects for this pitch variation and the price of the fault tolerant system 10 is lower because of the relaxed specification on the lens array 14a.

In all the embodiments described above it has been assumed that the output of each of the lasers are not astigmatic because the source of the output from each of the lasers is at the same location in space even though as mentioned above the divergence angle is different in the two directions. Thus the lenses in the collimating lens array 14a do not have to correct for astigmatism. This invention is not limited to lasers which do not have astigmatism. To correct for astigmatism the lenses in the collimating lens array 14a would have to be anamorphic or the lenses in the corrector lens array 16a could correct for the astigmatism.

The third major element from the left of FIG. 1A is the array of microlenses 16a that correct each of the laser beams transmitted through the array of "collimating" lenses 14a for tilt, focus or divergence, astigmatism, coma and spherical aberration 25 required for the performance of the optical transformer 18a. This corrector lens array 16a contains one microlens, preferably diffractive, for each beam. Each individual microlens contains the appropriate number of zones, each of appropriate geometry for the desired correction. Across each zone, the wavefront is retarded by $2\pi$ or equivalently by one wavelength. Each appropriate zone preferably has sixteen (16) levels. Although diffractive optics having as few as two levels may be used, the greater number of levels provide greater efficiency in transmission of the laser power. On the other hand, the optics could be smoothed to remove the discreteness of the levels. In one embodiment, the corrector lens array is fabricated by milling using an excimer laser.

Figure 2:
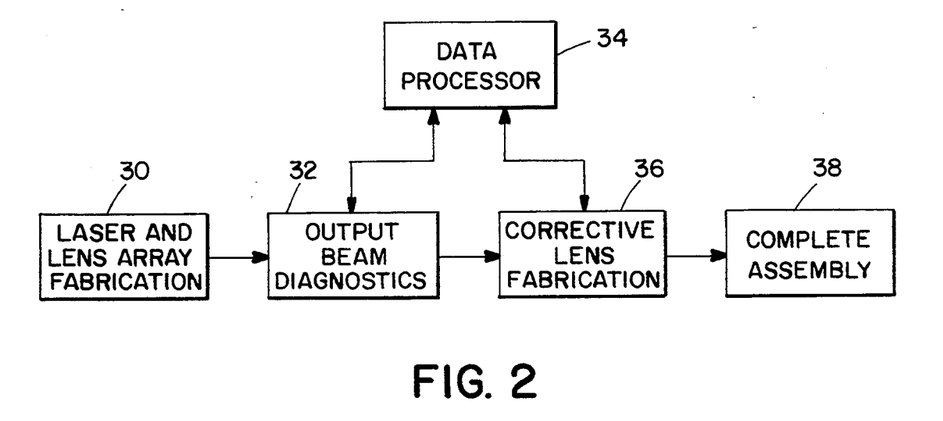
FIG. 2 is an illustration of an assembly line embodying the invention.

An assembly line for mass producing the laser array and combining optics of FIGS. 1A and B is illustrated in FIG. 2. The laser array 12 and collimating lens array 14 are fabricated using conventional techniques at 30. Thereafter, the individual output beams from the laser array and collimating lens array are diagnosed at 32 under control of a data processor 34. As illustrated in FIG. 1A, the output beams from the collimating lens array 14 are imperfect due to loose manufacturing tolerances. Based on the information obtained during the diagnostics, the data processor 34 then controls fabrication, as by laser milling, of the individual corrector lenses of the array 16 at 36. As illustrated in FIG. 1A, this fabrication of the corrector lenses is specific to the individual lasers and collimating lenses to correct for faults in the lasers and collimating lenses and provides a clean output of collimated beams suitable for input into the optical transformer 18. Assembly of the system including the transformer 18 can then be completed at 38.

The use of excimer laser ablation to generate the proper circular or elliptical ring structure for the corrective microlens fabrication on a substrate transparent to the diode laser wavelength requires a number of considerations. The requirement of an economical method necessitates the ablation of one ring per laser pulse at laser densities no greater than a few joules per square centimeter. At these energy densities, it must be possible to ablate to a depth of the order of the wavelength of the diode laser. Organic polymers are one class of appropriate materials that can be so ablated. Specifically, in the detailed embodiment shown in FIG. 2 below, the selected material is polyimide. This is a material that has been researched in laser ablation studies. In addition, it is possible to spin the polymer onto thermally stable glass or quartz substrates. Also, the polyimide can be spun on the surface of the collimating lens array and the corrector lenses integrated on top of the collimating lens array. The plume formation rate (which can absorb the later part of the laser pulse) in polyimide is slow (of the order of microseconds after the laser pulse ablation with XeCl at 308 nm) allowing for long pulse inductively stabilized laser technology to be used. With inductive stabilization technology, a compact laser design is possible for very high pulse repetition rate devices due to the gain in pulse repetition rate per unit gas flow, and this technique also allows for flat electrodes generating uniform field near diffraction limited beams.

Almost all present processing of materials using excimer laser ablation requires beam homogenizers to obtain the required beam uniformity. A consequence of beam uniformity using homogenizers is increased beam divergence. Our process requires focusing the beam to dimensions of the order of the wavelength of the ablation laser, and a large beam divergence system would imply throwing away a substantial amount of laser energy. Thus, a uniform beam near diffraction limited excimer obtained with inductive stabilization is extremely beneficial.

Figure 3:
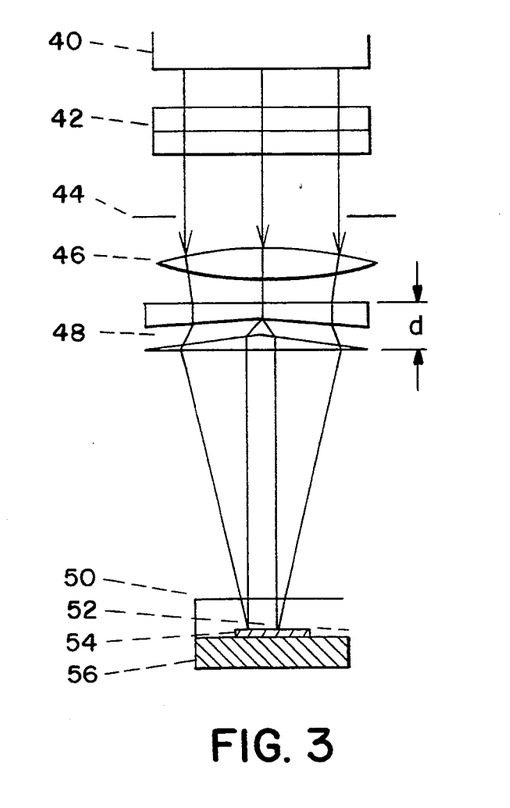
FIG. 3 is one embodiment of the system to fabricate the corrector lens array that uses an excimer laser to machine an array of diffractive optic lenses.

One embodiment of the optical set-up for the laser ablation of the corrective diffractive lenses is shown in FIG. 3. The fraction of the laser output incident on a lens 46 is controlled by a rotating pair of cross-polarizers 42 and an iris 44. The focused light exiting from the lens 46 is incident on a diverging-converging axicon pair 48. An axicon is a surface of revolution and those shown used in FIG. 3 are flat cones. Because of the axicon, the focused beam on a microlens substrate 54 is a circle and the diameter of the circle 52 is determined by the distance d in the figure between flat surfaces of the two axicons of the pair. This distance d shown in the figure in the z-dimension is changed using a computer-controlled micromanipulator not shown in the figure. X-y-z motion of the lens substrate 54 by the x-y-z-computer controlled stage 56 places the concentric rings for each diode laser in the array in the proper place. The apertures and the iris have high reflecting dielectric coatings to prevent heating of the apertures.

There is a need for incubation pulses which break up the long chained molecules and prepare the polymer material for laser ablation. We irradiate the whole diameter of the lens region with incubation laser pulses before writing the diffractive optical lens. The corrector microlens array substrate 54 is placed in a vacuum-gas chamber 50. The use of helium and hydrogen can prevent debris formation and the use of oxygen can react away debris formed in the ablation process. Vacuum may allow debris to settle in areas far away from the substrate.

The intensity of the beam on the substrate and the length of the laser pulse determine the depth of each of the ablated annuluses of the diffractive lens. The intensity is determined by the rotatable cross polarizer 42 in conjunction with the size of the opening of the iris 44. The width of each ablated annulus is determined by the opening of the iris 44 which changes the diameter of the beam incident on the lens. This diameter of the beam determines the effective f number of the lens and therefore the width of the focused beam at the ablated annulus. Each circularly symmetric diffractive lens is designed to correct for incident focus aberration. The position of the centroid of the lens is controlled to be appropriate to correct for tilt errors. The excimer laser beam, the iris, the rotatable cross polarizer, the distance between the two axicon of the pair, the and x and y motion of the corrector plate substrate are controlled by a computer program. Such a computer controlled machine is capable of moving an excimer laser beam that can be focused to near the diffraction limit over the material to be processed.

This system allows for the fabrication of one-of-a-kind micron size devices with sub-micron precision, consistent with the lenses in the corrector lens array being diffractive lenses with 16 levels. As described above, these lenses are made by shaping the laser beam and then milling a circular annulus of the order of a diode wavelength depth in a single shot. With each successive laser pulse, the laser beam is reconfigured to mill the required grooves in the lens substrate. After one corrector lens is fabricated, stage 56 is programmed to move to the appropriate centroid of the next lens. Given these conditions it is possible to mill a two-dimensional array of 2000 lens with 10 zone lenses of 16 levels each in 32 seconds with a ten kilohertz laser or in less than one minute.

The above lens array size and lens detail and repetition frequency of the excimer laser are given as a representative example of the state-of-the-art but would be varied depending on requirements. In particular, for simplicity of description the design described as an example above is to correct for tilt, focus and spherically symmetric aberrations such as spherical aberrations. Other designs can be used to correct if required nonspherical aberrations such as astigmatism.

The corrector lenses may be purely diffractive as discussed above, refractive (geometric) or a combination of the two. A particularly advantageous combination is to correct for tilt using refractive optics and to correct for focus and higher order aberration using diffractive optics. A disadvantage of diffractive optics in correcting for tilt is the large number of zones which are required. In the combination, the diffractive optics may be formed directly on the refractive optics.

An alternative to the milling technique presented in FIG. 3 is to direct the laser through a mask which is then imaged onto the lens substrate through a demagnifying lens system. The demagnification may be varied to change the size of the annulus being milled. The mask may itself comprise an iris for changing the outer diameter of an imaged annulus. Many masks may be made available, with the computer selecting the appropriate mask to be placed in the laser path for milling of each groove. To mill the geometric optics, the mask may be of variable density. In one example, a single variable density mask may be selected to mill the lens for correction of tilt, and a number of annulus-forming masks may then be sequentially selected for milling the grooves of the diffractive optics of the lens substrate.

As discussed above, enabling technology for the excimer laser required for the micro-machining has been the development of inductively stabilized excimer lasers. It also has been shown that an order of magnitude gain in pulse repetition rate for a given gas flow is achieved in these devices, as well as much improved pulse to pulse energy reproducibility. Kilohertz laser devices have been operated using the inductive stabilization technique with estimated gas clearance of only 1/5th discharge volume per shot. Thus, an excimer laser device with two discharge volume clearances per shot should be capable of 10 kHz operation with energy per pulse in the range of one millijoule. Although this energy is too large for the writing or machining of submicron structures, it is deemed easy to achieve and will be available for large area processing applications. In the fabrication of the corrector lens array there are chromatic aberrations in the optical elements. Thus the linewidths as well as the pulse-wavelength resettability of the excimer laser is stringent as is the case in excimer based photolithography devices and is of the order of 1–2 picometers.

Figure 4:
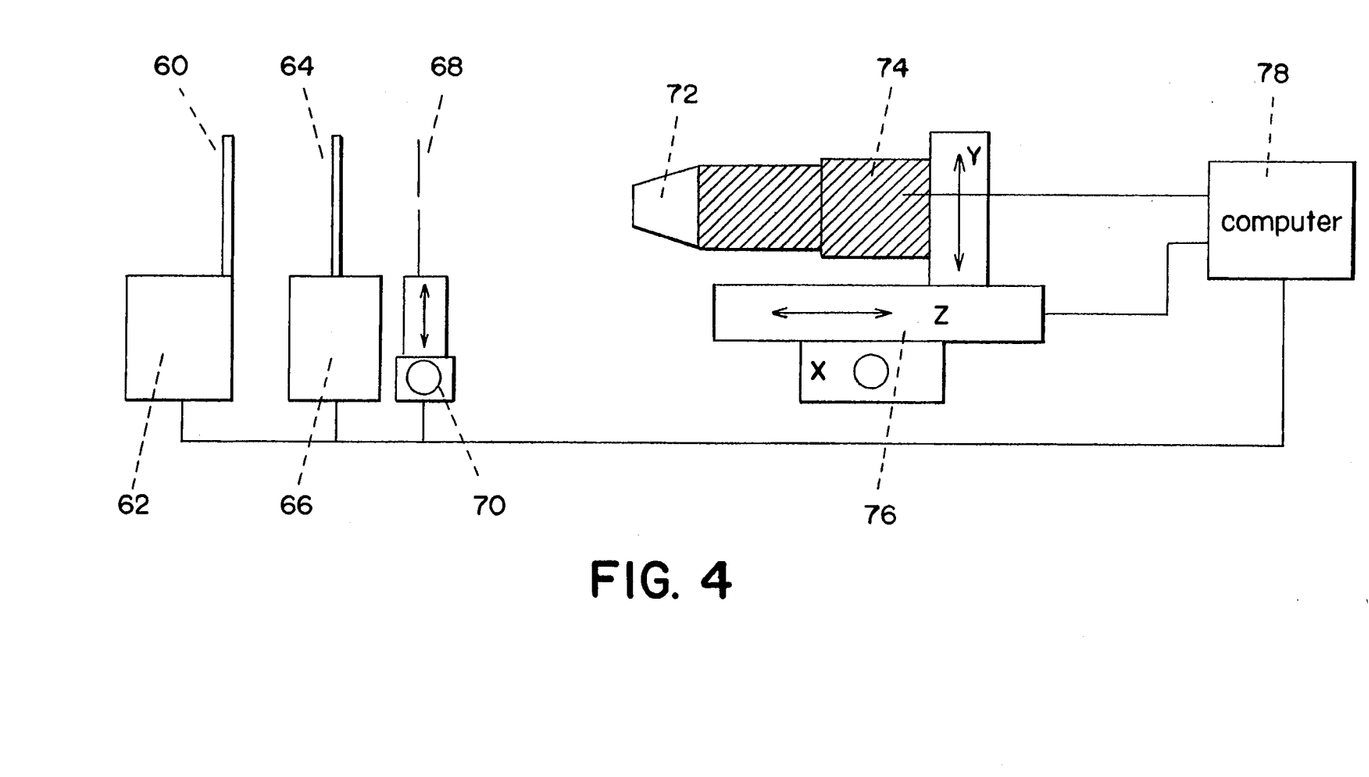
FIG. 4 is one embodiment of the beam diagnostic system used to specify the required design of each corrector lens in the corrector lens array.

While we have described the fabrication of the corrector lens array, we have not described the custom design of each of the lenses in the array. The first step in the design of this corrector lens array is the experimental measurement of each of the beams (beamlets) that will be incident on the corrector lenses. One embodiment of this diagnostic system is shown in FIG. 4. The laser array 60 and the collimating lens array 64 are shown in this figure mounted on stages 62 and 65 with appropriate translation and rotation capability. Alternatively, the laser and lens arrays may be mounted together on a single stage. An iris 68 on a computer controlled stage 70 is translated at the output of the collimating lens array so each beamlet is individually measured. The beam is magnified by an aberration free microscope objective 72. A CCD based intensity profiler 74 is used to characterize the output beam. The computer controlled translation stage 76 moves the elements 72 and 74 in the z-direction shown on the figure. Thus the beam is measured at three distances from the slit. From the change in shape and lateral position of the beam at the three distances, the tilt, focus, astigmatism and spherical aberration are determined. Appropriate details of the beam shape and position are fed into the computer 70 which is programmed to determine these parameters of the beam. The sampling iris and the measuring equipment are automatically moved from beamlet to beamlet and respective boresight to respective boresight. The time required to take these measurements and to have them digested by the computer is of the order of or shorter than the time of one minute mentioned above for the fabrication of the corrector lens array. The measurement system is designed to be consistent with demonstrating the feasibility of achieving this goal of mass-producibility.

Figure 5:
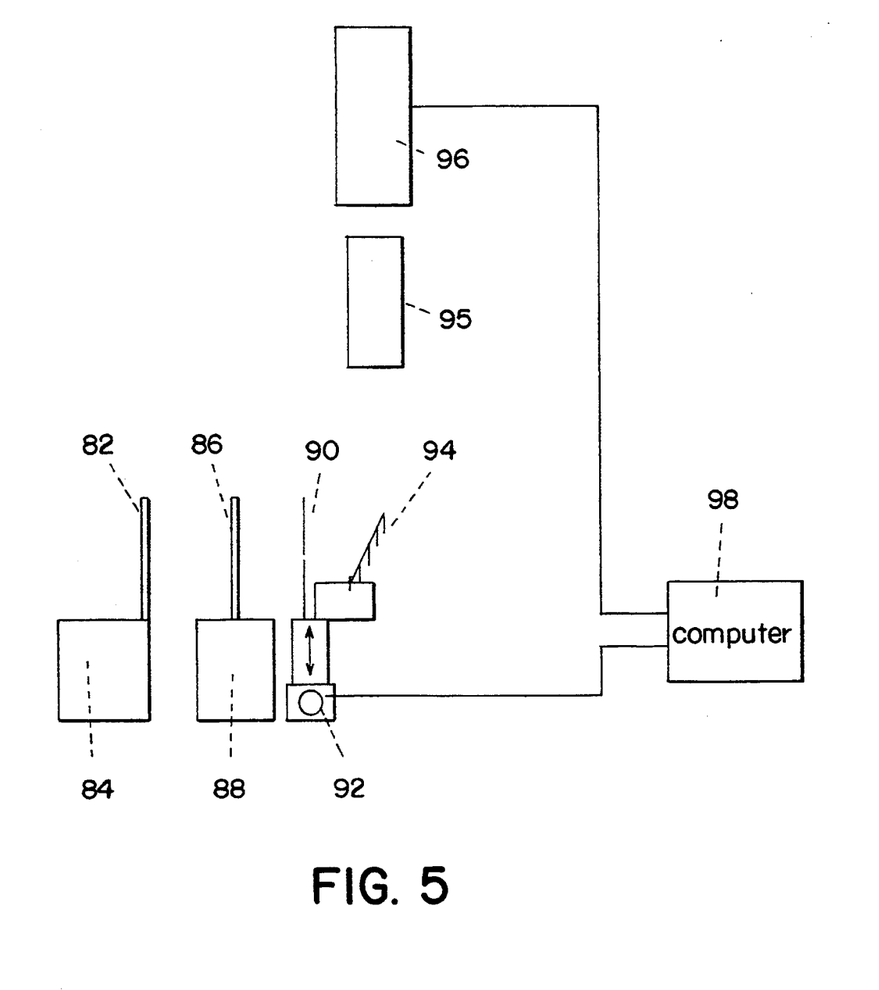
FIG. 5 is another embodiment of the beam diagnostic system used to specify the required design of each corrector lens in the corrector lens array.

Another embodiment of the diagnostic system is shown in FIG. 5. The laser array 82 and the collimating lens array 86 are shown in this figure mounted on stages 84 and 88 with appropriate translation and rotation capability. An iris 90 on a computer controlled stage 92 is translated at the output of the collimating lens array so each beamlet is individually measured. A mirror 94 at 45° deflects the beam by 90° and the beam is directed into a wavefront analyzer. This analyzer is shown in FIG. 5 as a shearing interferometric wave analyzer 96. The output from 96 is the focus, astigmatism and spherical aberration of the beam. An optical relay system 95 reimages the beamlet wavefront at the output of the collimating lens so it is reproduced at the shear plates that are inside the wave analyzer 96. Thus the focus, astigmatism and spherical aberration of the beam from the collimating lens are exactly measured by the wave analyzer.

From the measurement of the focus or divergence and of the tilt of the beamlets, yet another computer program determines the milling of the corrector optics by the excimer laser described above. As described above, both the beam shaping and aperturing to obtain the desired circular or ellipsoidal shape of the excimer laser beam and the x and y motion of the corrector plate substrate are controlled by this computer program.

The design and fabrication of the optical transformer 18 (the element on the right of FIG. 1) is within the state-of-the-art. At Lincoln Laboratory, Leger et al. have demonstrated an optical transformer for the commercially available linear c-w diode laser array fabricated by Spectra Diode Laboratories (SDL3480). The state-of-the-art in the cant, tilt and bowing of the bar which contained the 100 laser array would have required custom-designed optics for the laser array used for optimal coupling into a fiber. The thrust of the invention is to use the corrective microoptics to mate a two-dimensional diode laser array with a mass-produced two-dimensional array of collimator microlenses and mass-produced optical transformer set. The fault-tolerance of the complete system will significantly reduce its cost.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. An optical system comprising:
   a laser array comprising a plurality of lasers illuminating along individual optic axes;
   combining optics for combining light from the plurality of lasers; and
   corrector optics including an array of corrector optical elements individually associated with the lasers, the corrector optical elements being of optical designs specific to associated lasers to correct faults in the lasers and associated combining optics.

2. An optical system as claimed in claim 1 wherein the combining optics include an array of combining optical elements individually associated with laser sources but being non-specific to manufacturing variations in the lasers.

3. An optical system as claimed in claim 2 wherein the array of combining optical elements includes collimator lenslets between the laser array and the corrector optics and an optical transformer for combining collimated beams from the corrector optics.

4. An optical system as claimed in claim 3 wherein the corrector optical elements comprise diffractive optics.

5. An optical system as claimed in claim 4 wherein the corrector optical elements comprise a combination of refractive optics and diffractive optics.

6. An optical system as claimed in claim 5 wherein refractive optics correct tilt and diffractive optics correct focus.

7. An optical system as claimed in claim 1 wherein the corrector optical elements comprise diffractive optics.

8. An optical system as claimed in claim 7 wherein the corrector optical elements comprise a combination of refractive optics and diffractive optics.

9. An optical system as claimed in claim 8 wherein refractive optics correct tilt and diffractive optics correct focus.

10. A method of manufacturing a laser array with associated optics comprising:
    fabricating a laser array and a first lens array, lenses of the first lens array being associated with individual lasers;
    diagnosing optical characteristics of the combined laser array and first lens array; and
    fabricating a corrector lens array, corrector lenses of the corrector lens array being associated with individual lasers and being of optical designs specific to associated lasers to correct faults in the combined laser array and first lens array.

11. A method as claimed in claim 10 wherein the first lens array comprises an array of collimator lenses.

12. A method as claimed in claim 11 comprising enhancing the fill factor of light from the lasers of the laser array through an optical transformer.

13. A method as claimed in claim 11 wherein the corrector lens array comprises diffractive optics.

14. A method as claimed in claim 13 wherein the corrector optical elements comprise a combination of refractive optics and diffractive optics.

15. An optical system as claimed in claim 14 wherein refractive optics correct tilt and diffractive optics correct focus.

16. A method as claimed in claim 14 wherein the corrector lens array is fabricated by a laser milling operation.

17. A method as claimed in claim 10 wherein the corrector lens array comprises diffractive optics and the diffractive optics are fabricated by a laser milling operation.

18. A method as claimed in claim 17 wherein the laser milling operation comprises sequentially generating light rings of controlled diameter, width and intensity to mill grooves of the diffractive optics into a lens substrate.

19. A method as claimed in claim 18 wherein the light rings are generated through an axicon pair.

20. A method as claimed in claim 19 wherein the width of the ring generated by the axicon pair is controlled by means of an iris.

21. A method as claimed in claim 20 wherein the intensity of the ring is controlled by cross polarizers.

22. A method as claimed in claim 10 wherein the diagnosing and fabricating steps diagnose and correct for laser tilt relative to the first lens array.

23. A method as claimed in claim 22 wherein the corrector lens array comprises diffractive optics and the diffractive optics are fabricated by a laser milling operation.

24. A method of manufacturing a diffractive lens element comprising:

shaping a laser beam to illuminate a ring on a lens substrate; and with successive laser pulses, controlling diameter, width and intensity of the ring to mill grooves of the diffractive lens element into the lens substrate.

25. A method as claimed in claim 24 wherein the light rings are generated through an axicon pair.

26. A method as claimed in claim 25 wherein the width of the ring generated by the axicon pair is controlled by means of an iris.

27. A method as claimed in claim 26 wherein the intensity of the ring is controlled by cross polarizers.

* * * * *

UNITED STATES PATENT AND TRADEMARK OFFICE
CERTIFICATE OF CORRECTION

PATENT NO. : 5,369,659

DATED : November 29, 1994

INVENTOR(S) : Horace W. Furumoto, William C. Goltsos, Robert H. Rediker and Robert Sze It is certified that error appears in the above-identified patent and that said Letters Patent is hereby corrected as shown below:

Col. 1, line 6, as the first paragraph following "Background of the Invention," insert the following:

--Government Funding
This invention was made with government support under Contract Number F19628-90-C-0002 awarded by the Air Force. The government has certain rights in the invention.--

Signed and Sealed this

Twenty-eight Day of February, 1995

Attest:

BRUCE LEHMAN

*Attesting Officer*    *Commissioner of Patents and Trademarks*